(12) United States Patent
Tseng

(10) Patent No.: US 8,404,983 B2
(45) Date of Patent: Mar. 26, 2013

(54) REMOVABLE ELECTRIC CONTROLLER FOR GARAGE DOOR OPENER

(75) Inventor: Kun Shi Tseng, Taichung (TW)

(73) Assignee: Rhine Electronic Co., Ltd., Taichung (TW)

( * ) Notice: Subject to any disclaimer, the term of this patent is extended or adjusted under 35 U.S.C. 154(b) by 177 days.

(21) Appl. No.: 13/108,058

(22) Filed: May 16, 2011

(65) Prior Publication Data

US 2012/0293976 A1 Nov. 22, 2012

(51) Int. Cl.
 *H05K 7/00* (2006.01)
(52) U.S. Cl. ........ 174/520; 174/535; 174/559; 174/563; 361/748; 361/807; 361/808

(58) Field of Classification Search .................. 174/50, 174/520, 535, 559, 560–563; 361/679.01, 361/748, 756, 760, 807, 808, 825
See application file for complete search history.

*Primary Examiner* — Angel R Estrada
*Assistant Examiner* — Dimary Lopez
(74) *Attorney, Agent, or Firm* — Ming Chow; Sinorica, LLC

(57) ABSTRACT

A removable electric controller for a garage door opener includes a base unit, a cover and a control box unit. A box lid of the control box unit is slidably connected to a connecting surface of the cover. A guide insertion end of a control circuit board of the control box unit is connected to a main connecting port module of a circuit terminal connecting plate on the base unit. The cover and the control box unit are detachable. A driving member, a light source member, an inductive circuit line and a power member of the base unit are connected to wiring port modules of the circuit terminal connecting plate, so that the wiring is in the way of modulization. The control circuit board of the control box unit can be replaced with ease, providing a convenient and simply assembly.

7 Claims, 7 Drawing Sheets ered garage door control structure comprises a controller body (50) and a control unit (60). The controller body (50) comprises a base (51), a cover (52), and a lampshade (53). The control unit (60) comprises a driving member (61), a light source member (62), and a circuit board (63). The driving member (61), the light source member (62) and the circuit board (63) of the control unit (60) are fixed to the base (51) of the controller body (50). The driving member (61) and the light source member (62) are electrically connected to the circuit board (63). The cover (52) and the lampshade (53) are coupled to the base (51). This control structure has the following problems.

1. It is inconvenient to use. The driving member, the light source member and the circuit board of the control unit are fixed to the base of the controller body, and the driving member and the light source member are electrically connected to the circuit board. This connection is complicated. When the circuit board malfunctions and needs replacement, it is necessary to renew the electric connection of the new circuit board so it is inconvenient to use.

2. It is difficult to assemble the control structure. The driving member and the light source member are electrically connected to the circuit board through conductive wires. In connection, the conductive wires may be wrongly connected and it is not easy to replace the circuit board so the assembly is difficult.

SUMMARY OF THE INVENTION

The primary object of the present invention is to provide a removable electric controller for a garage door opener to solve the problems of inconvenience use and difficult assembly.

According to the present invention, there is provided a removable electric controller for a garage door opener which comprises a base unit, a cover and a control box unit. The base unit comprises a base seat, a driving member, a light source member, a lampshade, an inductive circuit line, a power member, and a circuit terminal connecting plate. The circuit terminal connecting plate comprises a main connecting port module. The driving member, the light source member, the inductive circuit line, the power member and the circuit terminal connecting plate are fixedly connected to the base seat. The driving member, the light source member, the inductive circuit line and the power member are electrically connected to the circuit terminal connecting plate. The cover has a connecting surface. The connecting surface has an opening at a top end thereof. The cover is coupled to a central section of the base seat of the base unit. The opening of the connecting surface faces the circuit terminal connecting plate connected to the base seat of the base unit. The circuit terminal connecting plate is exposed out of the cover. The control box unit comprises a box lid and a control circuit board. The box lid has an open top side and an open rear side. The control circuit board has a guide insertion end. The control circuit board is located in the box lid. The guide insertion end of the control circuit board is connected to the main connecting port module of the circuit terminal connecting plate on the base unit. The box lid of the control box unit covers the connecting surface of the cover.

The cover is coupled to the central section of the base seat of the base unit. The engaging protrusions of the box lid of the control box unit are slidably connected to the engaging parts at the left and right sides of the connecting surface of the cover. The guide insertion end of the control circuit board of the control box unit is connected to the main connecting port module of the circuit terminal connecting plate on the base unit. By the engaging protrusions of the box lid of the control box unit to engage with the engaging parts at the left and right sides of the connecting surface of the cover as well as the guide insertion end of the control circuit board of the control box unit to connect with the main connecting port module of the circuit terminal connecting plate on the base unit, the cover and the control box unit are detachable. The driving member, the light source member, the inductive circuit line and the power member of the base unit are connected to the wiring port modules of the circuit terminal connecting plate, so that the wiring is in the way of modulization. The control circuit board of the control box unit can be replaced with ease, providing a convenient and simply assembly.

DETAILED DESCRIPTION OF THE PREFERRED EMBODIMENTS

Embodiments of the present invention will now be described, by way of example only, with reference to the accompanying drawings.

Figure 1:
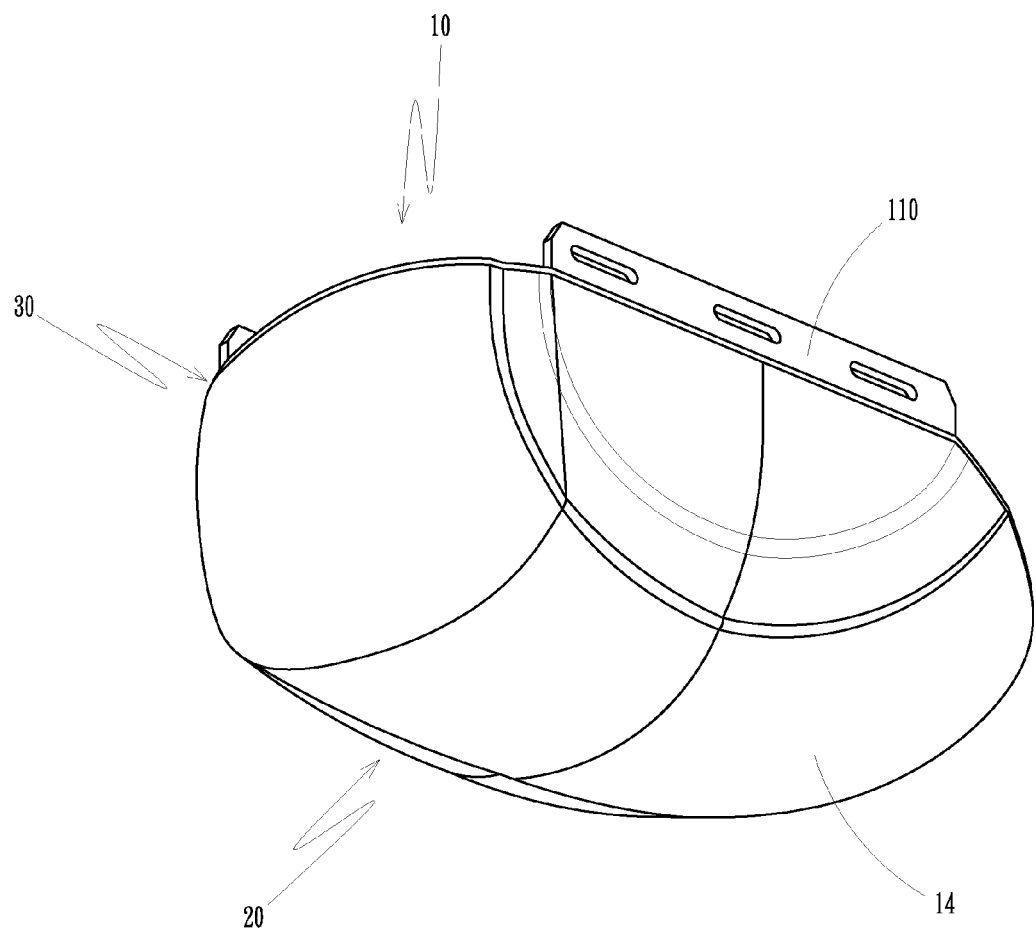
FIG. 1 is a perspective view according to a preferred embodiment of the present invention.
Figure 2:
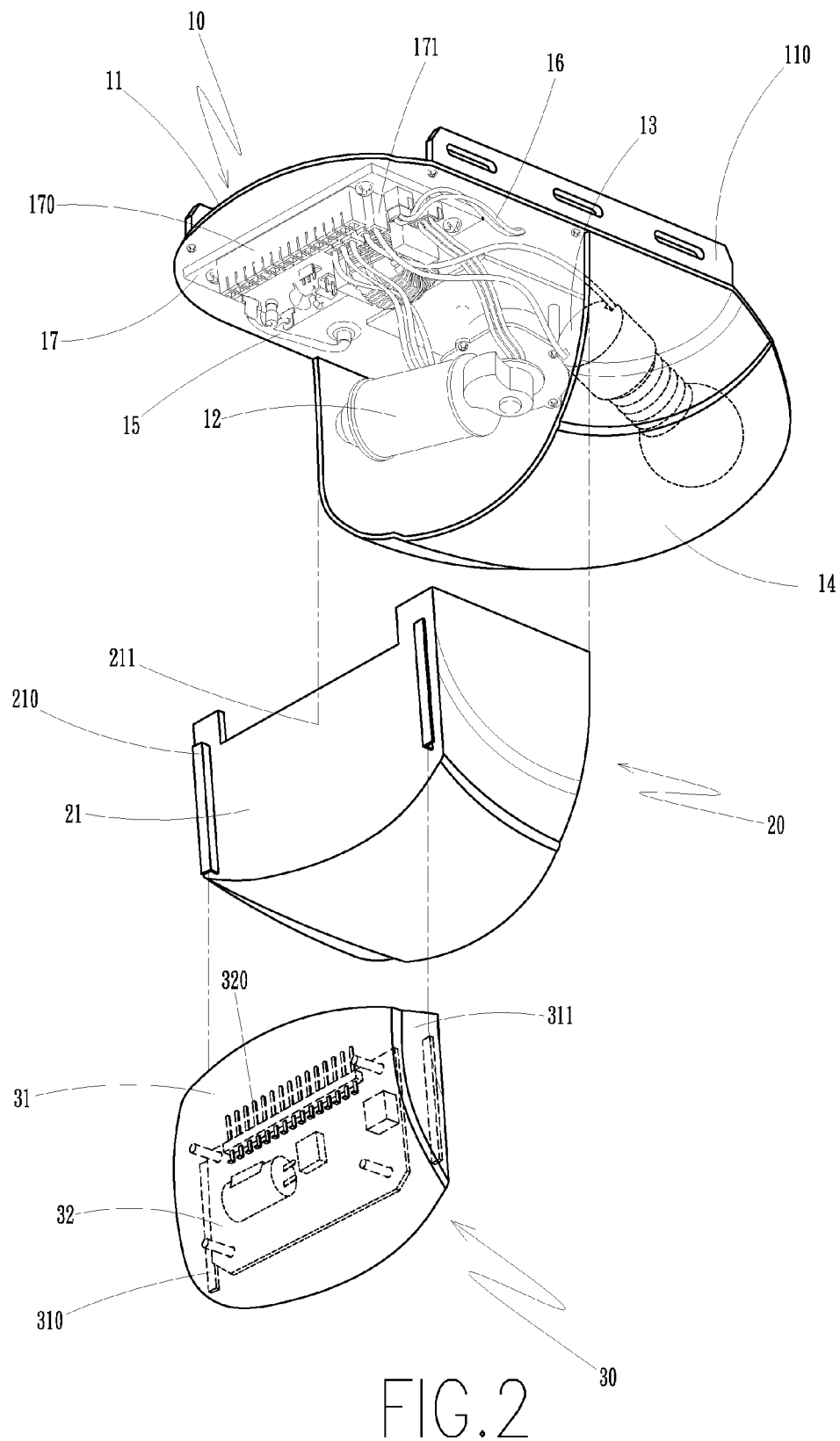
FIG. 2 is an exploded view according to the preferred embodiment of the present invention.
Figure 3:
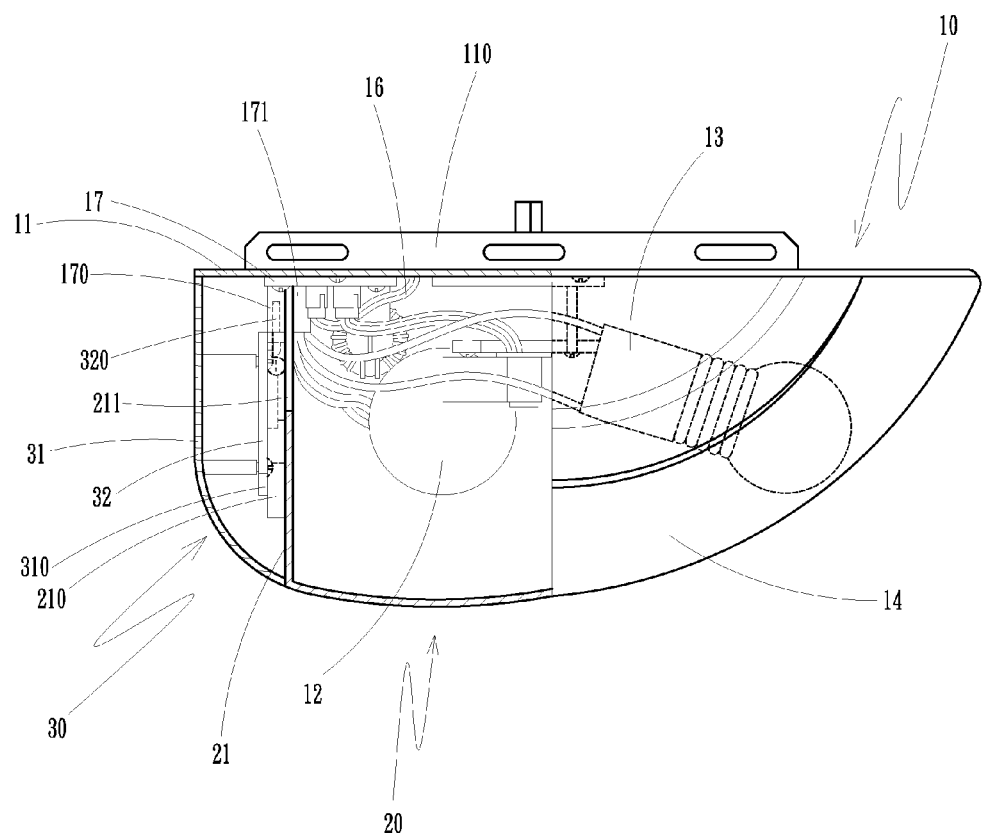
FIG. 3 is a side sectional view according to the preferred embodiment of the present invention.

As shown in FIG. 1 through FIG. 3, a removable electric controller for a garage door opener according to a preferred embodiment of the present invention comprises a base unit (10), a cover (20) and a control box unit (30).

The base unit (10) comprises a base seat (11), a driving member (12), a light source member (13), a lampshade (14), an inductive circuit line (15), a power member (16), and a circuit terminal connecting plate (17). Two sides of a top surface of the base seat (11) are connected with a pair of brackets (110). The circuit terminal connecting plate (17) comprises a main connecting port module (170) and a plurality of wiring port modules (171). The driving member (12), the light source member (13), the inductive circuit line (15), the power member (16), and the circuit terminal connecting plate (17) are fixedly connected to the base seat (11). The wiring terminals of the driving member (12), the light source member (13), the inductive circuit line (15), and the power member (16) are connected to the wiring port modules (171) of the circuit terminal connecting plate (17) in the way of modulization.

The cover (20) has a connecting surface (21) which is vertically disposed at a rear side thereof. Left and right sides of the connecting surface (21) are provided with a pair of engaging parts (210). The connecting surface (21) has an opening (211) at a top end thereof. The cover (20) is coupled to a central section of the base seat (11) of the base unit (10). The opening (211) of the connecting surface (21) faces the circuit terminal connecting plate (17) connected to the base seat (11) of the base unit (10), so that the circuit terminal connecting plate (17) is exposed out of the cover (20).

The control box unit (30) comprises a box lid (31) and a control circuit board (32). The box lid (31) has an open top side and an open rear side. The rear side of the box lid (31) is provided with engaging protrusions (310). The box lid (31) has a press portion (311) at a front side thereof for applying force. The control circuit board (32) has a guide insertion end (320). The control circuit board (32) is located in the box lid (31). The engaging protrusions (310) of the box lid (31) are slidably connected to the engaging parts (210) at the two sides of the connecting surface (21) of the cover (20). The guide insertion end (320) of the control circuit board (32) is connected to the main connecting port module (170) of the circuit terminal connecting plate (17) on the base unit (10).

Figure 4:
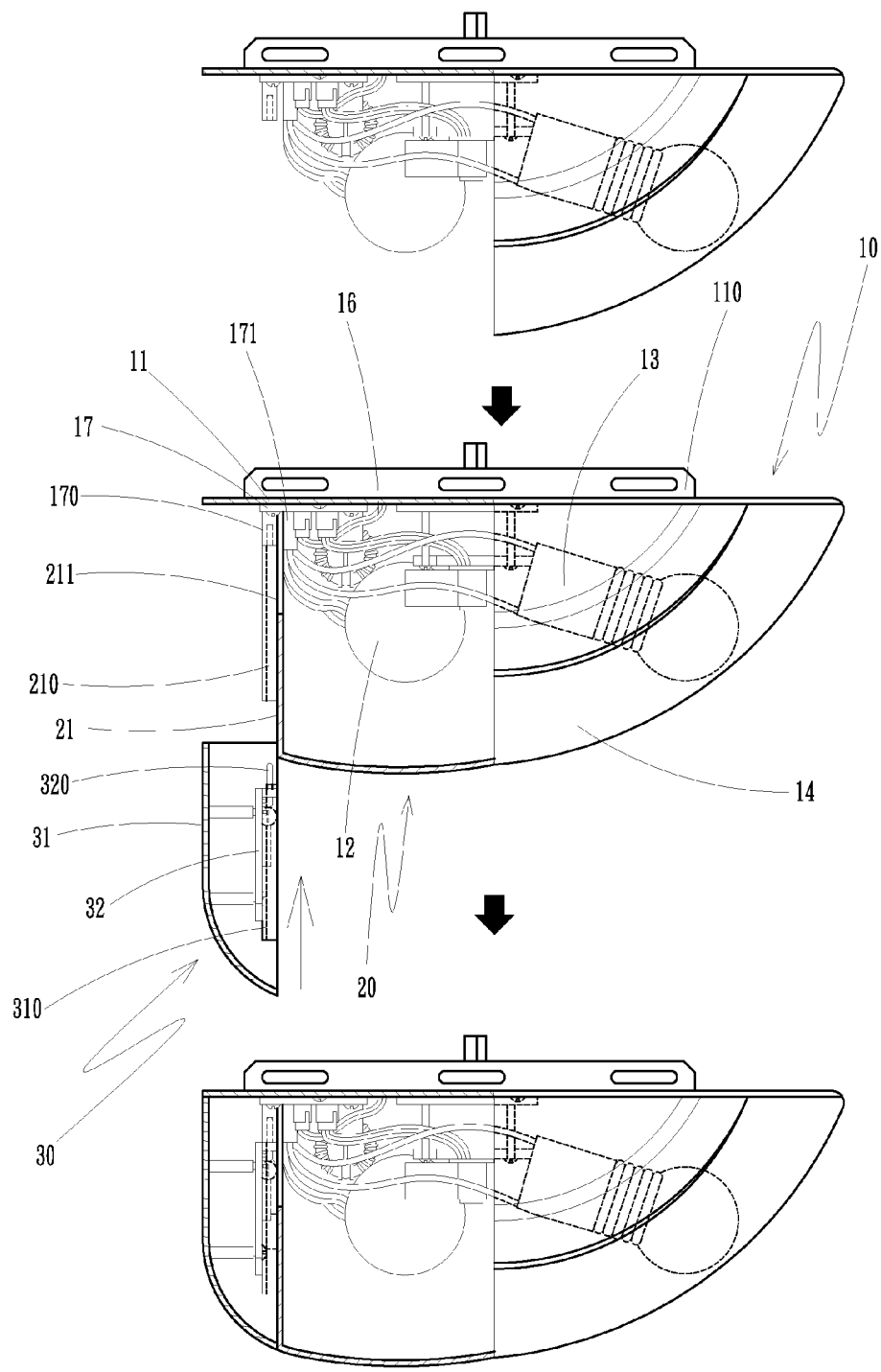
FIG. 4 is a schematic view showing connection of the control box unit and the cover according to the preferred embodiment of the present invention.
Figure 5:
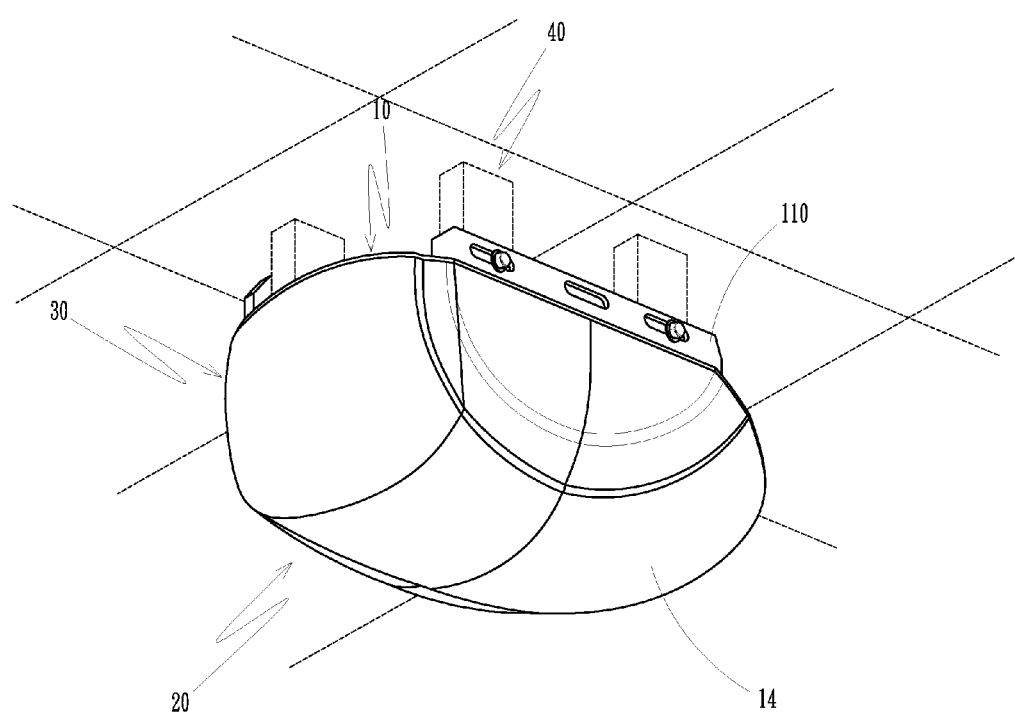
FIG. 5 is a schematic view of the preferred embodiment of the present invention coupled to the ceiling.

FIG. 4 and FIG. 5 are schematic views showing the control box unit and the cover of the electric controller of the present invention coupled to a ceiling. The brackets (110) of the base seat (11) of the base unit (10) are coupled to a connection rod (40) fixed to on the ceiling. The cover (20) is coupled to the central section of the base seat (11) of the base unit (10). The engaging protrusions (310) of the box lid (31) of the control box unit (30) are slidably connected to the engaging parts (210) at the left and right sides of the connecting surface (21) of the cover (20). The guide insertion end (320) of the control circuit board (32) of the control box unit (30) is connected to the main connecting port module (170) of the circuit terminal connecting plate (17) on the base unit (10). By the engaging protrusions (310) of the box lid (31) of the control box unit (30) to engage with the engaging parts (210) at the left and right sides of the connecting surface (21) of the cover (20) as well as the guide insertion end (320) of the control circuit board (32) of the control box unit (30) to connect with the main connecting port module (170) of the circuit terminal connecting plate (17) on the base unit (10), the cover (20) and the control box unit (30) are detachable. The driving member (12), the light source member (13), the inductive circuit line (15) and the power member (16) of the base unit (10) are connected to the wiring port modules (171) of the circuit terminal connecting plate (17), so that the wiring is in the way of modulization. The control circuit board (32) of the control box unit (30) can be replaced with ease, providing a convenient and simply assembly.

Figure 6:
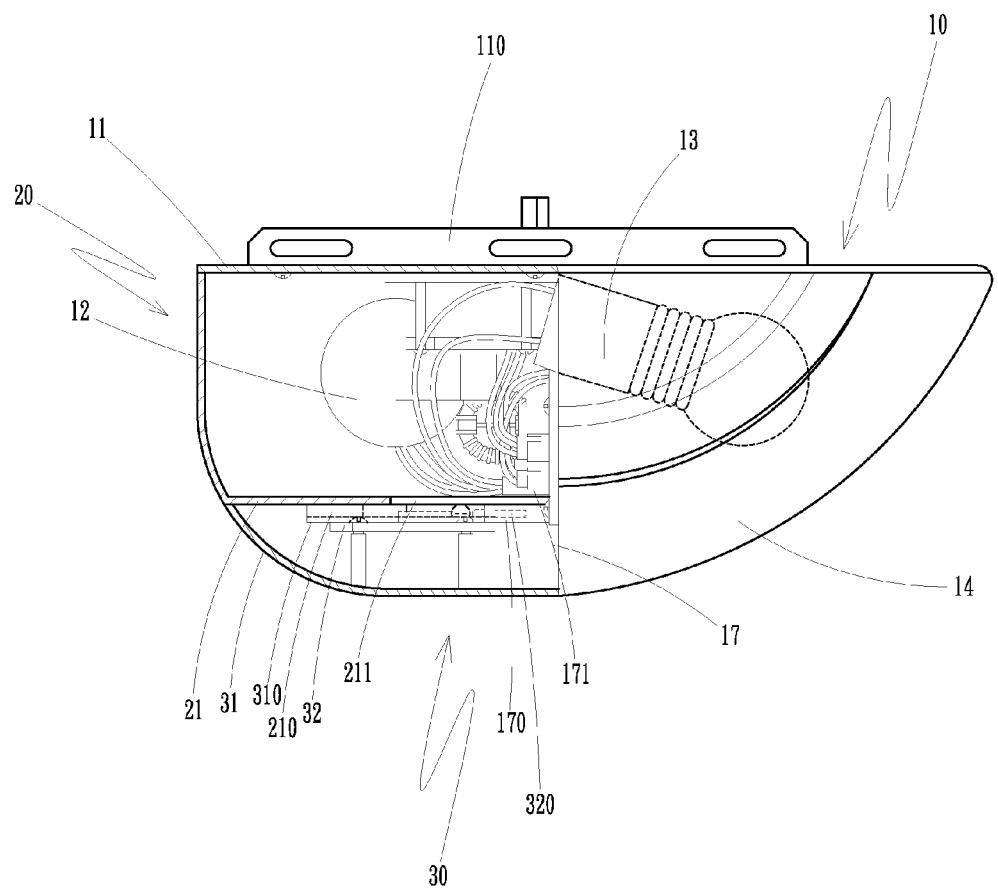
FIG. 6 is a side sectional view according to another embodiment of the present invention.
Figure 7:
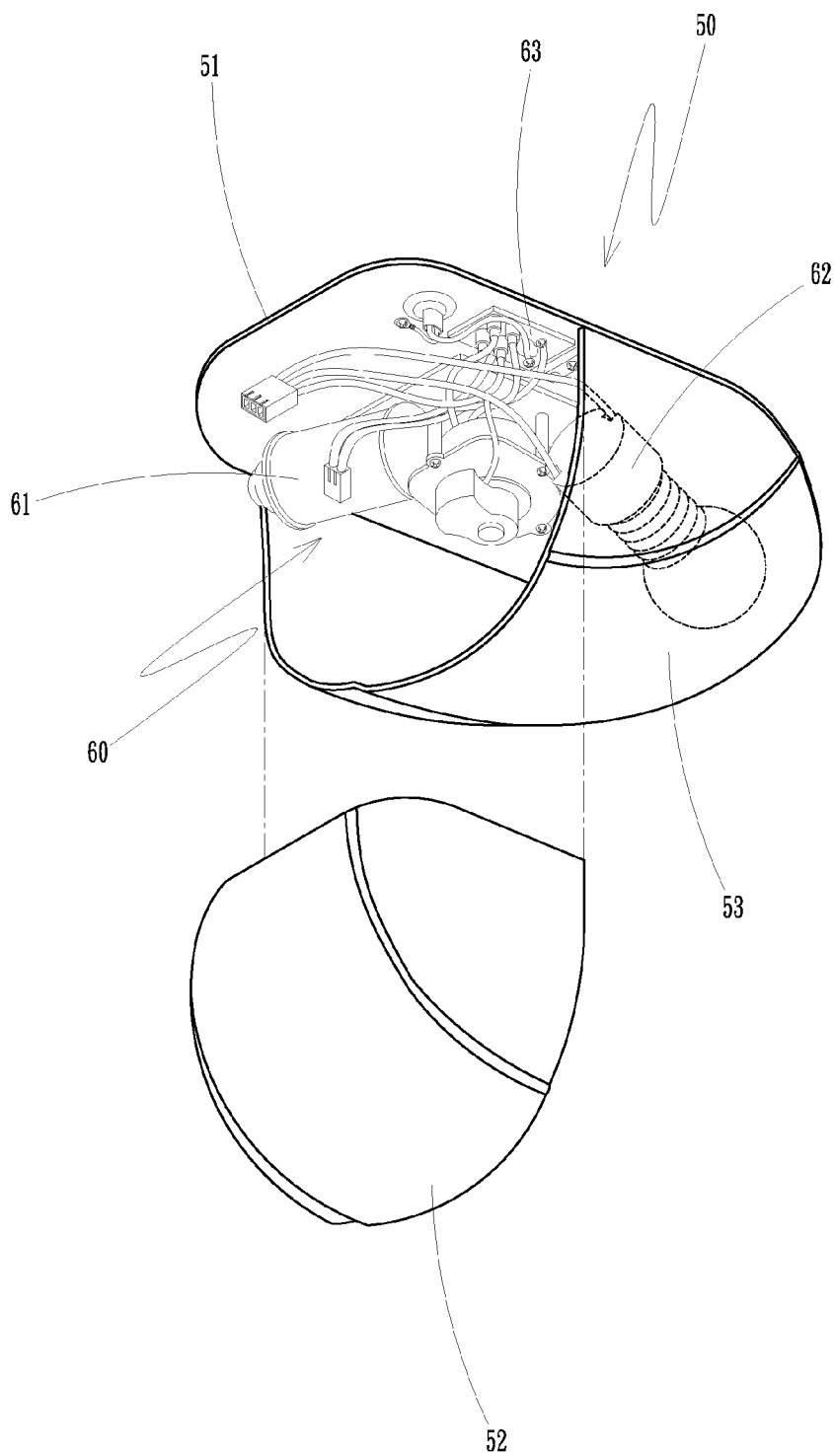
FIG. 7 is a schematic view of the prior art.

FIG. 6 shows another embodiment of the present invention, which is substantially similar to the embodiment shown in FIG. 1 through FIG. 3 with the exceptions described hereinafter. The connecting surface (21) of the cover (20) is horizontally disposed opposite the top end of the cover (20). Two sides of the connecting surface (21) are provided with a pair of engaging parts (210). The connecting surface (21) has an opening (211). The cover (20) is coupled to the central section of the base seat (11) of the base unit (10). The opening (211) of the connecting surface (21) faces the circuit terminal connecting plate (17) connected to the base seat (11) of the base unit (10), so that the circuit terminal connecting plate (17) is exposed out of the cover (20). The engaging protrusions (310) of the box lid (31) are slidably connected to the engaging parts (210) at the two sides of the connecting surface (21) of the cover (20). The guide insertion end (320) of the control circuit board (32) is connected to the main connecting port module (170) of the circuit terminal connecting plate (17) on the base unit (10).

The present invention has the following advantages:

1. It is convenient to use. The engaging protrusions of the box lid of the control box unit are slidably connected to the engaging parts of the connecting surface of the cover. The guide insertion end of the control circuit board is connected to the main connecting port module of the circuit terminal connecting plate on the base unit. They are detachable so it is convenient to use.

2. The assembly is easy. The driving member, the light source member, the inductive circuit line and the power member of the base unit are connected to the wiring port modules of the circuit terminal connecting plate, so that the wiring is in the way of modulization. The control circuit board of the control box unit can be replaced with ease, providing a simply assembly.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. A removable electric controller for a garage door opener, comprising:

a base unit, the base unit comprising a base seat, a driving member, a light source member, a lampshade, an inductive circuit line, a power member and a circuit terminal connecting plate, the circuit terminal connecting plate comprising a main connecting port module, the driving member, the light source member, the inductive circuit line, the power member and the circuit terminal connecting plate being fixedly connected to the base seat, the driving member, the light source member, the inductive circuit line and the power member being electrically connected to the circuit terminal connecting plate;

a cover, the cover having a connecting surface, the connecting surface having an opening at a top end thereof, the cover being coupled to a central section of the base seat of the base unit, the opening of the connecting surface facing the circuit terminal connecting plate connected to the base seat of the base unit, the circuit terminal connecting plate being exposed out of the cover; and a control box unit, the control box unit comprising a box lid and a control circuit board, the box lid having an open top side and an open rear side, the control circuit board having a guide insertion end, the control circuit board being located in the box lid, the guide insertion end of the control circuit board being connected to the main connecting port module of the circuit terminal connecting plate on the base unit, the box lid of the control box unit covering the connecting surface of the cover.

2. The electric controller as claimed in claim 1, wherein two sides of a top surface of the base seat are connected with a pair of brackets which are coupled to a connection rod fixed to a ceiling.

3. The electric controller as claimed in claim 1, wherein the circuit terminal connecting plate connected to the base unit further comprises a plurality of wiring port modules for connection of wiring terminals of the driving member, the light source member, the inductive circuit line and the power member.

4. The electric controller as claimed in claim 1, wherein the connecting surface of the cover is vertically disposed at a rear side of the cover.

5. The electric controller as claimed in claim 1, wherein the connecting surface of the cover is horizontally disposed opposite the top end of the cover.

6. The electric controller as claimed in claim 1, wherein the box lid of the control box unit has a press portion at a front side thereof for applying force.

7. The electric controller as claimed in claim 1, wherein left and right sides of the connecting surface of the cover are provided with a pair of engaging parts, the rear side of the box lid is provided with engaging protrusions, and the engaging protrusions of the box lid are slidably connected to the engaging parts at the left and right sides of the connecting surface of the cover.

\* \* \* \* \*